United States Patent
Wu

(10) Patent No.: US 11,189,644 B2
(45) Date of Patent: Nov. 30, 2021

(54) ARRAY SUBSTRATE AND DISPLAY PANEL

(71) Applicant: Xiamen Tianma Micro-Electronics Co., Ltd., Xiamen (CN)

(72) Inventor: Hao Wu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 479 days.

(21) Appl. No.: 16/227,471

(22) Filed: Dec. 20, 2018

(65) Prior Publication Data

US 2020/0135763 A1  Apr. 30, 2020

(30) Foreign Application Priority Data

Oct. 31, 2018  (CN) .......................... 201811288447.8

(51) Int. Cl.
*H01L 27/12*  (2006.01)

(52) U.S. Cl.
CPC ........ *H01L 27/124* (2013.01); *H01L 27/1218* (2013.01)

(58) Field of Classification Search
CPC ............... H01L 27/124; H01L 27/1218; H01L 27/3267
See application file for complete search history.

(56) References Cited

U.S. PATENT DOCUMENTS

| 10,559,253 B1 * | 2/2020 | Li | G09G 3/3225 |
| 2019/0235332 A1 * | 8/2019 | Yu | G09G 3/3648 |
| 2019/0304366 A1 * | 10/2019 | Ka | G02F 1/136286 |
| 2020/0058242 A1 * | 2/2020 | Liu | H01L 27/32 |

FOREIGN PATENT DOCUMENTS

| CN | 101017258 A | | 8/2007 | |
| CN | 103728750 A | | 4/2014 | |
| CN | 107564412 A | * | 1/2018 | ........... G09G 3/3258 |
| CN | 107993581 A | | 5/2018 | |
| CN | 109148473 A | * | 1/2019 | |
| EP | 3422094 A1 | * | 1/2019 | ....... G02F 1/136286 |

\* cited by examiner

*Primary Examiner* — David A Zarneke
(74) *Attorney, Agent, or Firm* — Anova Law Group, PLLC

(57) ABSTRACT

An array substrate and a display panel are provided. The array substrate comprises a display area including a first and a second display area parallelly arranged along a first direction, wherein the second display area includes a first edge portion extending along a second direction; a non-display area including a first and a second non-display area, wherein in the second direction, the first non-display area is disposed at one side of the display area and includes a first sub-non-display area and a second sub-non-display area; at least one notch formed by recessing the first edge portion toward an inside of the second display area; data lines; and at least one driving chip. An orthogonal projection of the at least one driving chip onto the array substrate is at least partially located in the second sub-non-display area. The second non-display area is disposed at perimeter of the at least one notch.

18 Claims, 15 Drawing Sheets

ARRAY SUBSTRATE AND DISPLAY PANEL

CROSS-REFERENCES TO RELATED APPLICATIONS

This application claims the priority of Chinese Patent Application No. CN201811288447.8, filed on Oct. 31, 2018, the entire contents of all of which are incorporated herein by reference.

FIELD OF THE DISCLOSURE

The present disclosure generally relates to the display technology and, more particularly, relates to an array substrate and a display panel thereof.

BACKGROUND

In existing display devices, such as displays, televisions, mobile phones, tablets, etc., often have generally regular rectangular screens. With continuous development of display technology and the diversified user demands on the appearance of display devices, simple rectangular display devices may not meet the consumer desires. Therefore, various shapes of display devices have emerged. In the existing technologies, the display panel is often designed to have a shape other than a regular rectangle, and such a display panel is generally named as an irregular-shaped display panel.

The irregular-shaped display panels are able to diversify the screen of the display devices, and are applied to various products such as advertisement display screens, information indicating screens, vehicle screens, smart watches, smart bracelets, VR/AR glasses, etc., which have a wide range of applications. In addition, the irregular-shaped display panels are able to bypass some functional modules on the front panel of the display devices, such as a camera module, a sensor module or a speaker module, thereby improving the screen-to-body ratio of the display device and, accordingly, enhancing the display performance. Thus, the irregular-shaped display panels are more and more widely used.

The irregular-shaped display panel includes a regular display area and an irregular-shaped display area. Because the shapes of the regular display area and the irregular-shaped display area are different, signal lines arranged in the regular display area and the signal lines arranged in the irregular-shaped display area have different lengths and loads, which results in different charging levels of sub-pixels in the regular display area and the irregular-shaped display area. As a result, the screen displayed by the irregular-shaped display panel is split, degrading the display performance.

Thus, irregular-shaped display panels, which are capable of reducing the load difference and suppressing the split-screen to improve the display performance, are highly desired. The disclosed array substrate and display panel thereof are directed to solve one or more problems set forth above and other problems.

BRIEF SUMMARY OF THE DISCLOSURE

One aspect of the present disclosure provides an array substrate. The array substrate comprises a display area including a first display area and a second display area parallelly arranged along a first direction, wherein the second display area includes a first edge portion extending along a second direction; a non-display area including a first non-display area and a second non-display area, wherein in the second direction, the first non-display area is disposed at one side of the display area and includes a first sub-non-display area and a second sub-non-display area parallelly arranged along the first direction, the first sub-non-display area and the second sub-non-display area are disposed corresponding to the first display area and the second display area, respectively; at least one notch, wherein the first edge portion of the second display area is recessed toward an inside of the second display area to form the at least one notch; a plurality of data lines, wherein the plurality of data lines include a plurality of first data lines and a plurality of second data lines, the first data lines are disposed in the first display area and extending along the second direction, a second data line includes a first portion, a second portion and a winding portion, the first portion and the second portion are both disposed in the second display area and extending in the second direction, and the winding portion is disposed in the second non-display area; and at least one driving chip electrically connected to the data lines, wherein an orthogonal projection of the at least one driving chip onto the array substrate is at least partially located in the second sub-non-display area. The second non-display area is disposed at perimeter of the at least one notch, and the first direction is perpendicular to the second direction.

Another aspect of the present disclosure provides an array substrate. The array substrate comprises a display area including a first display area and a second display area parallelly arranged along a first direction, wherein the second display area includes a first edge portion extending along a second direction; a non-display area including a first non-display area, a second non-display area, a third non-display area and a fourth non-display area, wherein in the second direction, the first non-display area is disposed at one side of the display area; at least one notch, wherein the first edge portion of the second display area is recessed toward an inside of the second display area to form the at least one notch; a first driving chip and a second driving chip, wherein an orthogonal projection of the first driving chip onto the array substrate is disposed in the first non-display area, and an orthogonal projection of the second driving chip onto the array substrate is disposed in one of the third non-display area and the fourth non-display area; a plurality of data lines including a plurality of first data lines and a plurality of second data lines. The first data lines are disposed in the first display area, extending along the second direction, and electrically connected to the first driving chip. A second data line at least partially passes through the second non-display area and includes a first portion and a second portion. The first portion includes a first sub-portion extending in the second direction and a first bent portion extending in the first direction, the first sub-portion includes a portion disclosed in the second display area and another portion passing through the second non-display area, and the first bent portion is disposed in the second display area and is electrically connected to the second driving chip. The second portion includes a second sub-portion extending along the second direction and a second bent portion extending along the first direction, the second sub-portion and the second bent portion are both disposed in the second display area, and the second bent portion is electrically connected to the second driving chip. The second non-display area is disposed at perimeter of the at least one notch. The third non-display area, the at least one notch, and the fourth non-display area are arranged along the second direction, and the first direction is perpendicular to the second direction.

Another aspect of the present disclosure provides a display panel. The display panel comprises the disclosed array substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined under conditions without conflicts.

The present disclosure provides an improved array substrate and a display panel thereof which are capable of suppressing the split-screen and improving the display performance.

Figure 1:
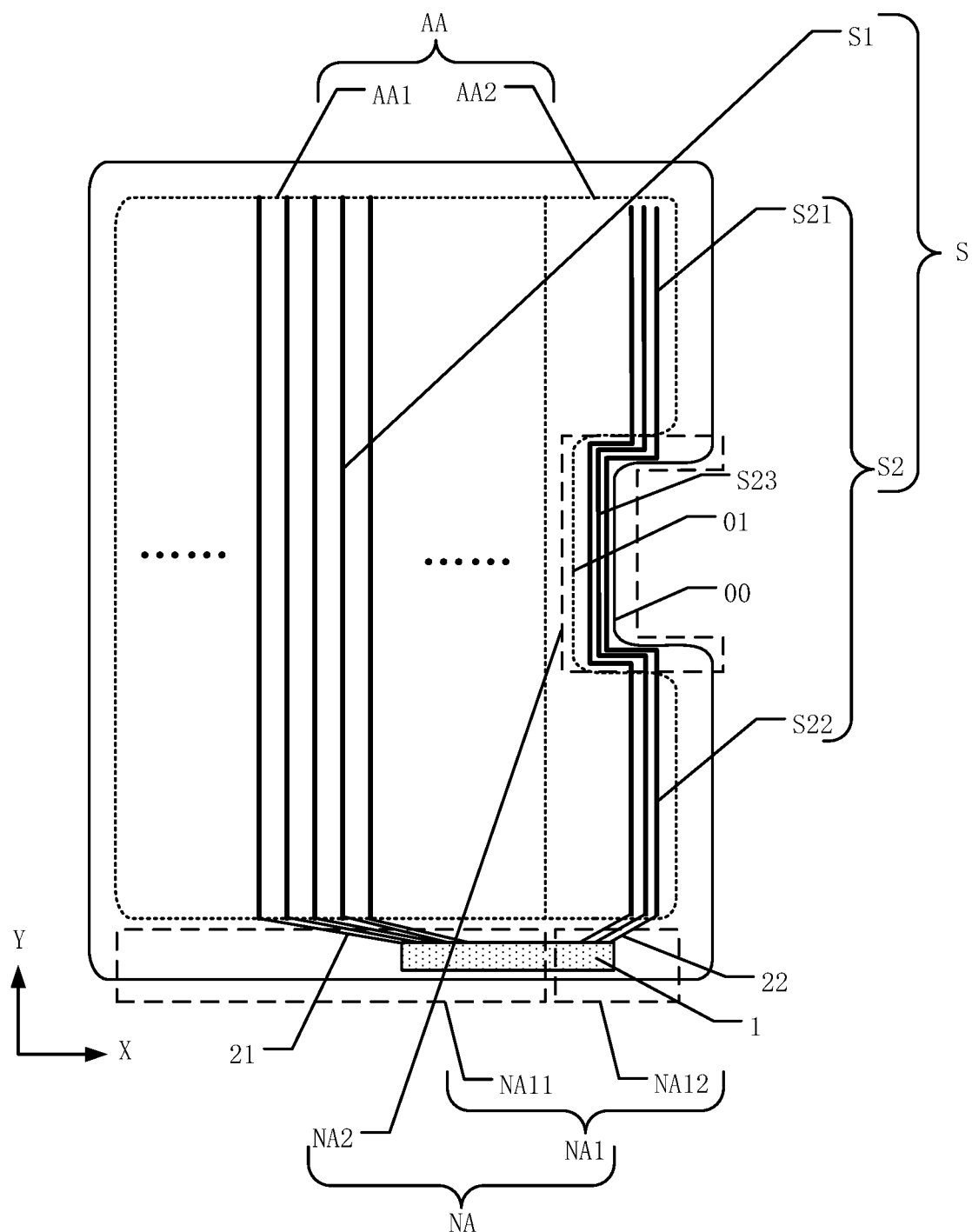
FIG. 1 illustrates a schematic top view of an exemplary array substrate consistent with the disclosed embodiments.

FIG. 1 illustrates a schematic top view of an exemplary array substrate consistent with the disclosed embodiments. As shown in FIG. 1, the array substrate may include a display area AA, a non-display area NA, and at least one notch 00. The non-display area NA may be disposed surrounding the display area AA. The display area AA may include a first display area AA1 and a second display area AA2 parallelly arranged along a first direction X. The second display area AA2 may include a first edge portion 01 extending along a second direction Y, and the first edge portion 01 may be recessed toward the inside of the second display area AA2 to form the at least one notch 00.

The non-display area NA may include a first non-display area NA1 and a second non-display area NA2. In the second direction Y, the first non-display area NA1 may be disposed at one side of the display area AA. The first non-display area NA1 may include a first sub-non-display area NA11 and a second sub-non-display area NA12 parallelly arranged along the first direction X. The first sub-non-display area NA11 may be disposed corresponding to the first display area AA1, and the second sub-non-display area NA12 may be disposed corresponding to the second display area AA2. The second non-display area NA2 may be disposed at the perimeter of the notch 00.

The array substrate may include a plurality of data lines S, and the plurality of data lines S may include a plurality of first data lines S1 and a plurality of second data lines S2. The first data lines S1 may be disposed in the first display area AA1 and extending along the second direction Y. Each second data line S2 may include a first portion S21, a second portion S22, and a winding portion S23, in which the first portion S21 and the second portion S22 may be both disposed in the second display area AA2 and extending in the second direction Y, and the winding portion S23 may be disposed in the second non-display area NA2.

The array substrate may include at least one driving chip 1, which may be electrically connected to the data lines S. The orthogonal projection of the driving chip 1 onto the array substrate may be at least partially located in the second sub-non-display area NA12. In one embodiment, as shown in FIG. 1, the first direction X may be perpendicular to the second direction Y.

In the disclosed embodiments, the array substrate may include at least one notch 00, and the at least one notch 00 may be formed by recessing the first edge portion 01, which is extending along the second direction Y, towards the inside of the second display area AA2. Meanwhile, some of the plurality of data lines S may also extend along the second direction Y, i.e., the array substrate may be an irregular-shaped array substrate having the notch 00 disposed along the second direction Y. Such an irregular-shaped array substrate may satisfy the user demands for diversified shapes, and have wide applications.

The display area AA of the array substrate may include the first display area AA1 and the second display area AA2 parallelly arranged along the first direction X. The first data lines S1 may be disposed in the first display area AA1 and extending along the second direction Y. Each data line S2 may include the first portion S21, the second portion S22, and the winding portion S23. The first portion S21 and the second portion S22 may be both disposed in the second display area AA2 and extending in the second direction Y, and the winding portion S23 may be disposed in the second non-display area NA2 which is disposed at the perimeter of the notch 00. That is, a portion of each second data line S2 may be arranged by winding in the second non-display area NA2 which is disposed at the perimeter of the notch 00, such that the first portion S21, the second portion S22, and the winding portion S23 of the same second data line S2 may be able to receive the same controlling signal. Accordingly, the controlling signal may be uninterrupted, and the display effect and display quality may be improved.

The array substrate may include at least one driving chip 1, which may be electrically connected to the data lines S to provide a driving controlling signal to the data lines S. The orthogonal projection of the driving chip 1 onto the array substrate may be at least partially located in the second sub-non-display area NA12. In the first direction X, the array substrate may have a first side where the notch 10 is arranged and an opposing second side. In the second direction Y, the second sub-display area NA12 may be disposed at one side of the display area AA, and the second sub-display area NA12 may be disposed corresponding to the second display area AA2. That is, in the first direction X, the second sub-non-display area NA12 may be arranged closer to the first side of the array substrate than the first sub-display area NA11. Thus, through configuring the orthogonal projection of the driving chip 1 onto the array substrate to be at least partially located in the second sub-non-display area NA12, in the first direction X, the driving chip 1 on the array substrate may be arranged substantially close to the first side of the array substrate.

Because the second data line S2 has the winding portion S23, the length of the second data line S2 may be greater than the length of the first data line S1 and, accordingly, the second data line S2 and the first data line S1 may have a load difference. The data lines S may transmit pixel voltage signals. When the second data line S2 and the first data line S1 have a load difference, the pixels (not drawn in FIG. 1) electrically connected to the second data line S2 and the pixels electrically connected to the first data line S1 may exhibit different display effect. Thus, the display effects of the first display area AA1 and the second display area AA2 may nonuniform, and a split-screen phenomenon may occur.

To suppress the split-screen phenomenon, in the disclosed embodiments, the position of the driving chip 1 on the array substrate may be configured close to the first side of the array substrate in the first direction X, where the notch 00 is disposed at the first side of the array substrate. Thus, a length of a first connection line 21 between the first data line S1 and the driving chip 1 may be increased, and a length of a second connection line 22 between the second data line S2 and the driving chip 1 may be reduced. Accordingly, the total length of the first data line S1 and the first connection line 21 may substantially be the same as the total length of the second data line and the second connection line 22, thereby equalizing the load of the first data line S1 and the second data line S2, and reducing the display effect difference between the pixels electrically connected to the second data line S2 and the pixels electrically connected to the first data line S1. Accordingly, the display effects of the first display area AA1 and the second display area AA2 may tend to be uniform, and the split-screen phenomenon may be significantly suppressed.

In the disclosed embodiments, along the first direction X, through an asymmetric arrangement of the driving chip 1 in the first non-display area NA1, the length difference between the first data line S1 and the second data line S2 may be equalized and, thus, the load difference between the first data line S1 and the second data line S2 may be reduced. Accordingly, the split-screen phenomenon caused by non-uniform display between the first display area AA1 and the second display area AA2 may be suppressed, and the display performance of the display panel including the array substrate may be improved.

It should be noted that, in the discoed embodiments, the first direction X and the second direction Y may be perpendicular to each other. Generally, the first direction X is the extending direction of the scanning line (not drawn in FIG. 1) on the array substrate, i.e., the row direction, and second direction Y is a column direction perpendicular to the row direction. FIG. 1 merely illustrates that in the first direction X, the position of the driving chip 1 on the array substrate is closer to the first side of the array substrate (where the notch 1 is disposed at the first side) than the second side, however, how close the driving chip 1 is arranged to the first side of the array substrate is not limited by the present disclosure, as long as the position of the driving chip 1 is able to balance the load between the first data line S1 and the second data line S2, and suppress the display failure caused by the split-screen between the first display area AA1 and the second display area AA2.

Figure 2:
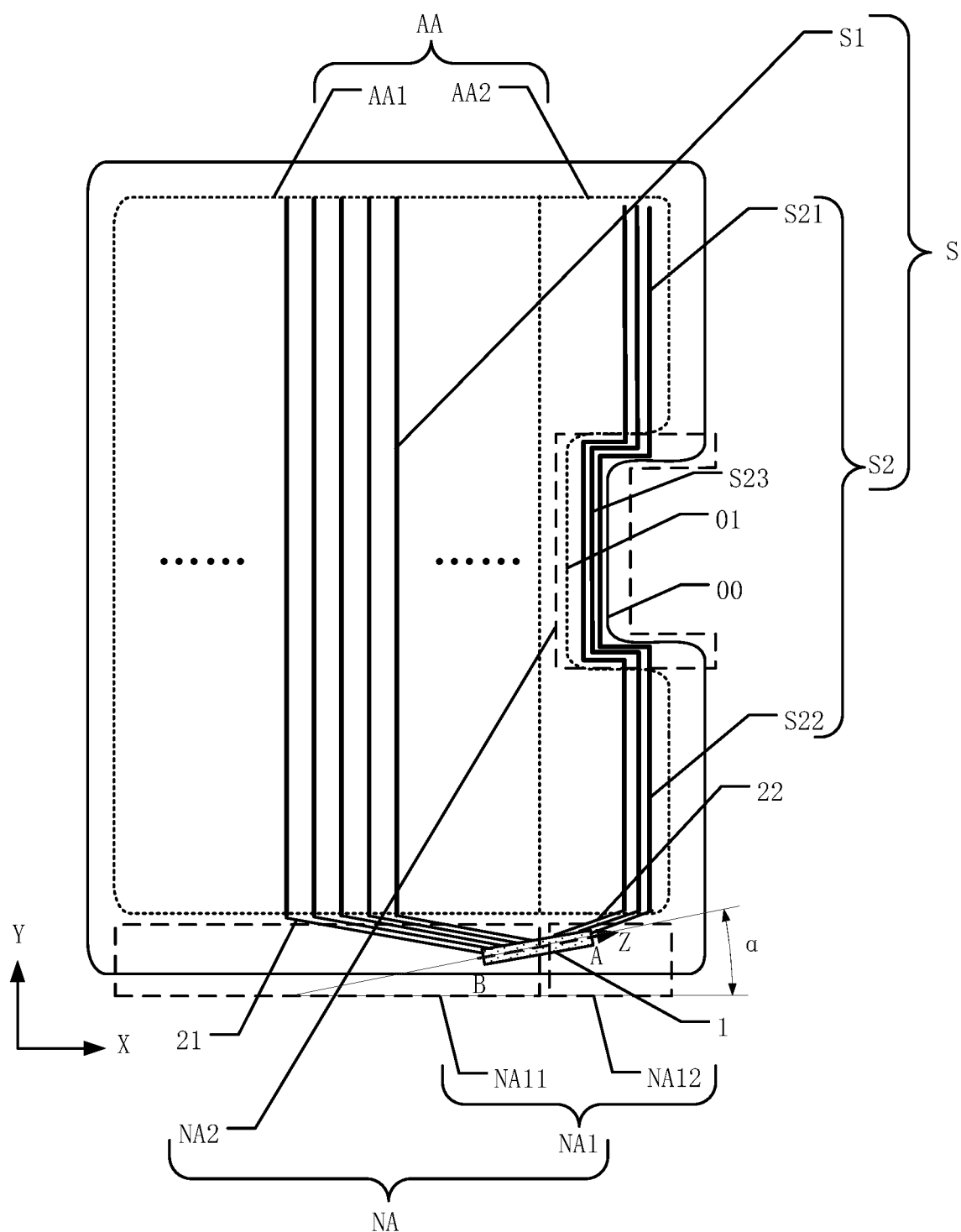
FIG. 2 illustrates a schematic top view of another exemplary array substrate consistent with the disclosed embodiments.

FIG. 2 illustrates a schematic top view of another exemplary array substrate consistent with the disclosed embodiments. The similarities between FIG. 1 and FIG. 2 are not repeated here, while certain differences may be explained. As shown in FIG. 2, the driving chip 1 may have a striped shape, and along a length/longitudinal direction of the driving chip 1, the driving chip 1 may have a first end A and a second end B. In the first direction X, the first end A may be an end close to the first edge portion 01, and the second end B may be an end far away from the first edge portion 01.

In the second direction, a vertical distance from the first end A to a side of the display area AA may be smaller than a vertical distance from the second end B to the side of the display area AA. For example, as shown in FIG. 2, the display area AA may have two sides extending in the first direction X, and in the second direction, the vertical distance from the first end A to a first side of the display area AA may be smaller than the vertical distance from the second end B to the first side of the display area AA, in which the first side of the display area AA is a side extending along the first direction X and close to the driving chip 1 along the second direction Y. The extending direction of the axis along the length direction of the driving chip 1 is defined as a third direction Z, and an acute angle formed by the third direction Z and the first direction X is defined as a first angle.

In the disclosed embodiments, the driving chip 1 may have a striped shape. To further balance the load between the first data line S1 and the second data line S2, the driving chip 1 may be disposed in an inclined manner in the first non-display area NA1. That is, the vertical distance from the first end A of the driving chip 1 to the first side of the display area AA may be smaller than the vertical distance from the second end B of the driving chip 1 to the first side of the display area AA. Thus, the length of the second connection line 22 between the first end A of the driving chip 1 and the second data line S2 may be reduced, while the length of the first connection line 21 between the second end B of the driving chip 1 and the first data line S1 may be increased and, accordingly, the first angle formed by the third direction Z and the first direction X may be an acute angle. The display failure caused by the split-screen between the first display area AA1 and the second display area AA2 may be further suppressed, and the display performance of the display panel including the array substrate may be improved.

In certain embodiments, as shown in FIG. 2, the first angle is α, where α≤15°. The array substrate shown in FIG. 2 further limits the range of the first angle α, i.e., the acute angle formed between the third direction Z and the first direction X. As the angle α becomes larger, the driving chip 1 at the first end A may get closer to the first side of the display area AA, and the inclination angle may become larger accordingly. The length of the second connection line 22 between the first end A of the driving chip 1 and the second data line S2 may be further reduced, and the length of the first connection line 21 between the second end B of the driving chip 1 and the first data line S1 may be further increased, thereby further balancing the load between the first data line S1 and the second data line S2. However, a substantially large inclination angle of the driving chip 1 may cause the width of the first non-display area NA1 to be widened in the second direction Y, thereby increasing the frame width of the non-display area of the array substrate, which is not in line with the narrow frame design of the display panel.

Thus, in the disclosed embodiments, through configuring the first angle α to be approximately equal to or smaller than 15°, the load difference between the first data line S1 and the second data line S2 may be balanced well, thereby suppressing the split-screen phenomenon. Meanwhile, the narrow frame design of the display panel may be realized, improving the display quality and display effect.

Figure 3:
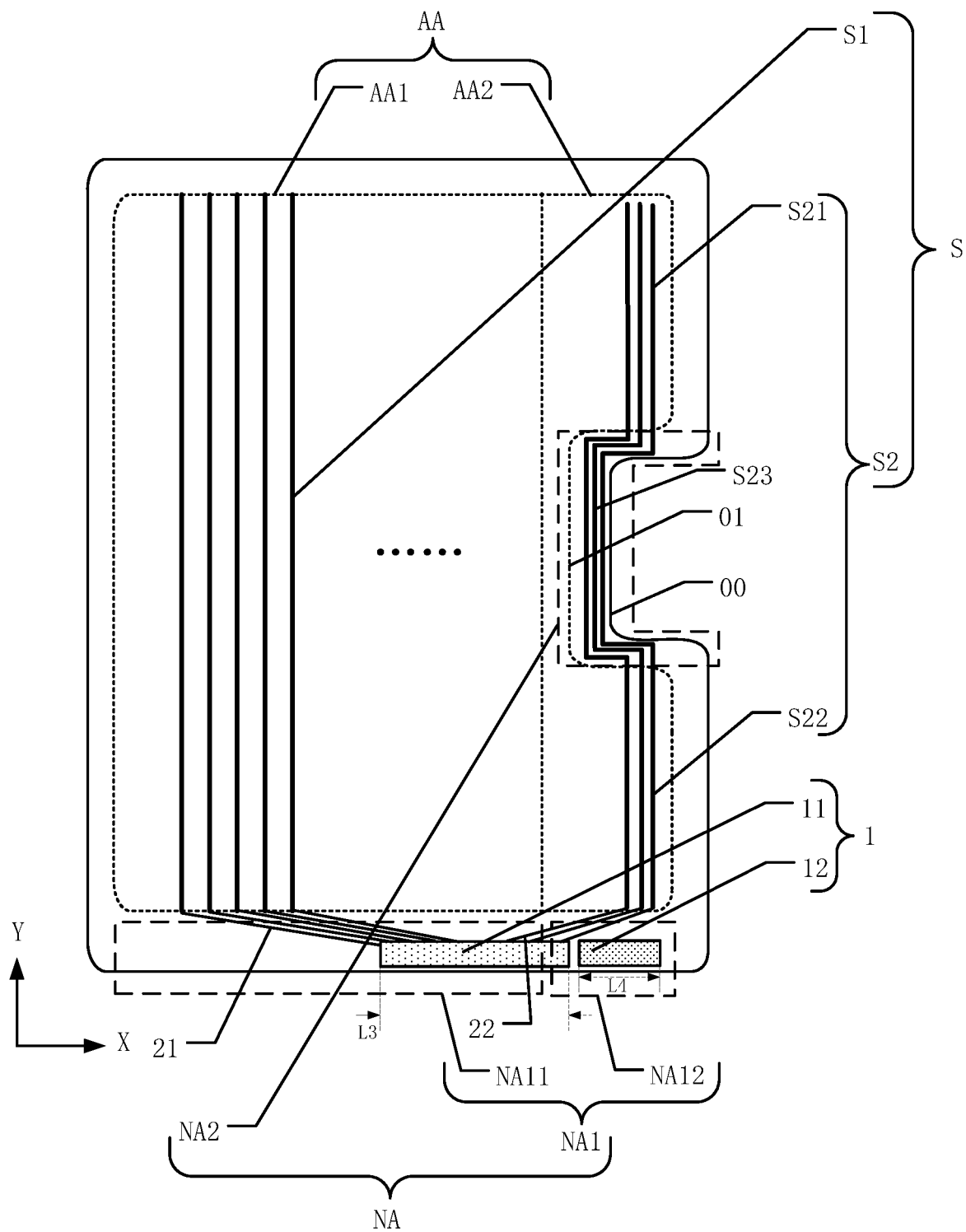
FIG. 3 illustrates a schematic top view of another exemplary array substrate consistent with the disclosed embodiments.

FIG. 3 illustrates a schematic top view of another exemplary array substrate consistent with the disclosed embodiments. The similarities between FIG. 1 and FIG. 3 are not repeated here, while certain differences may be explained. As shown in FIG. 3, the driving chip 1 may include a first driving chip 11 and a second driving chip 12, which may be both disposed in the first non-display area NA1. The first driving chip 11 and the second driving chip 12 each may have a striped shape.

In the disclosed embodiments, the display panel may include two driving chips: the first driving chip 11 and the second driving chip 12, both of which may be disposed at the first non-display area NA1 and electrically connected to the data lines S to provide a driving signal to the data lines S. The first driving chip 11 and the second driving chip 12 each may have a striped shape. Thus, when the first driving chip 11 and the second driving chip 12 are arranged along the length direction thereof in the first non-display area NA1, one of the first driving chip 11 and the second driving chip 12 may be closer to the first side of the array substrate (where the notch 00 is arranged at the first side of the array substrate) than the other. Accordingly, after the first driving chip 11 and the second driving chip 12 are electrically connected to the corresponding data lines S, the length of the second connection line 22 between the second data line S2 (which is close to the first side of the array substrate) and the driving chip 1 may be reduced, and the load difference between the first data line S1 and the second data line S2 may be balanced, thereby suppressing the split-screen of the display panel.

Figure 4:
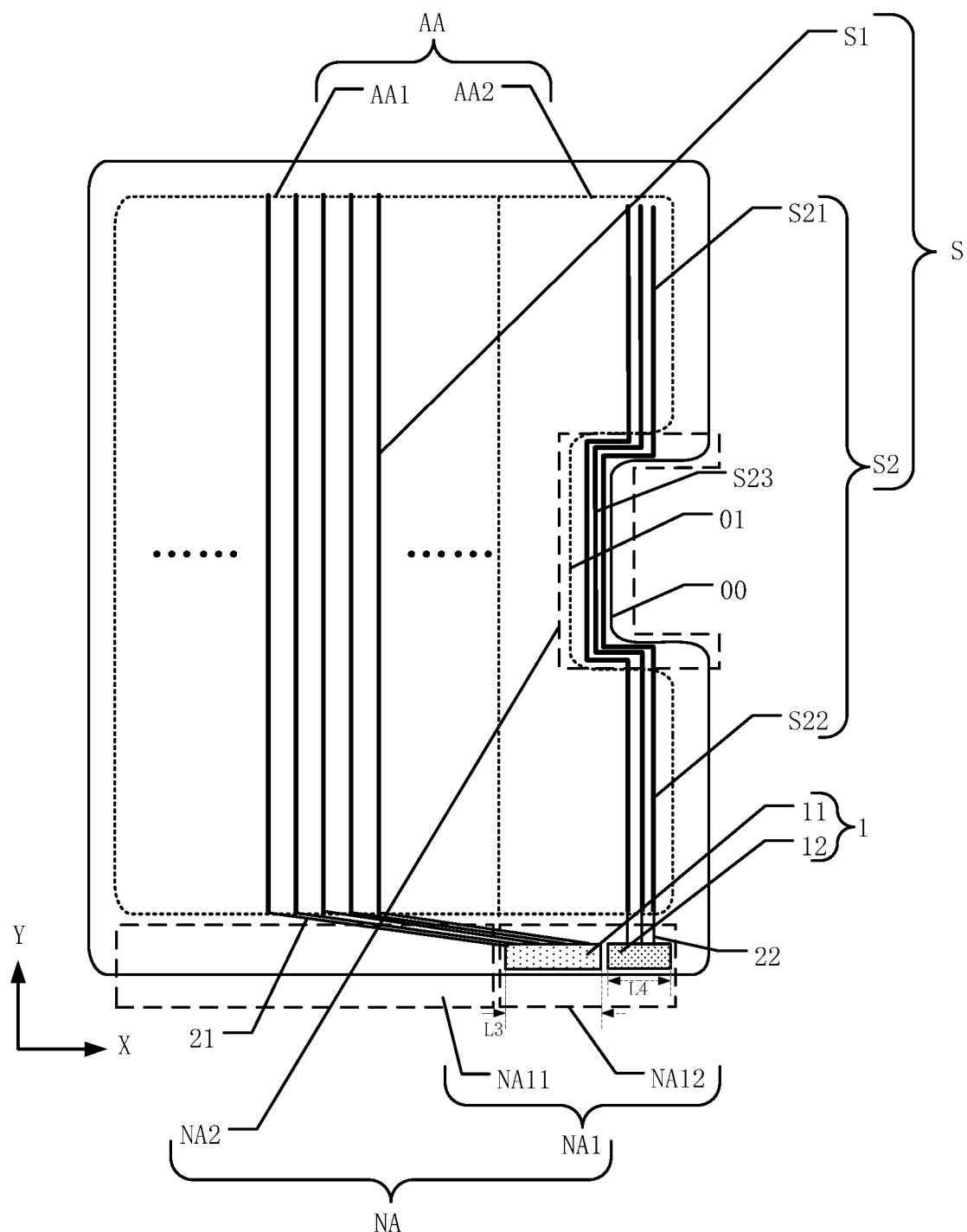
FIG. 4 illustrates a schematic top view of another exemplary array substrate consistent with the disclosed embodiments.

FIG. 4 illustrates a schematic top view of another exemplary array substrate consistent with the disclosed embodiments. The similarities between FIG. 1 and FIG. 4 are not repeated here, while certain differences may be explained. As shown in FIGS. 3-4, the orthogonal projection of the first driving chip 11 onto the array substrate may be at least partially disposed in the second sub-non-display area NA12, and the orthogonal projection of the second driving chip 12 onto the array substrate may be disposed in the second sub-non-display area NA12.

In the disclosed embodiments, in the first direction X, the second driving chip 12 may be arranged closer to the first side of the array substrate (where the notch 00 is arranged at the first side of the array substrate) than the first driving chip 11, the orthogonal projection of the second driving chip 12 onto the array substrate may be completely disposed in the second sub-non-display area NA12, and the orthogonal projection of the first driving chip 11 onto the array substrate may be at least partially disposed in the second sub-non-display area NA12. That is, in on embodiment, the orthogonal projection of the first driving chip 11 onto the array substrate may be partially disposed in the second sub-non-display area NA12, and partially disposed in the first non-sub-display area NA11 (shown in FIG. 3); in another embodiment, the orthogonal projection of the first driving chip 11 onto the array substrate may be completely disposed in the second sub-non-display area NA12 (as shown in FIG. 4). The structure shown in both FIG. 3 and FIG. 4 may balance the load difference between the first data line S1 and the second data line S2 after the first driving chip 11 and the second driving chip 12 are electrically connected to the data lines S, thereby suppressing the slit-screen of the display panel.

It should be noted that, FIGS. 3-4 merely illustrates exemplary arrangements of the first driving chip 11 and the second driving chip 12 in the first non-display area NA1 to suppress the split-screen. The electrical connection of the first data line S1, the second data line S2, the first driving chip 11, and the second driving chip 12 are not limited by the present disclosure, as long as the length of the second connection line between the second data line S2 and the driving chip 1 would be reduced. For example, as shown in FIG. 3, the orthogonal projection of the first driving chip 11 onto the array substrate may be partially disposed in the second sub-non-display area NA12, and partially disposed in the first non-sub-display area NM 1. The first driving chip 11 may be electrically connected to the first data lines S1 and second data lines S2. In FIG. 4, the orthogonal projection of the first driving chip 11 onto the array substrate may be completely disposed in the second sub-non-display area NA12, the first driving chip 11 may be electrically connected to the first data lines S1, and the second driving chip 12 may be electrically connected to the second data lines S2.

Figure 5:
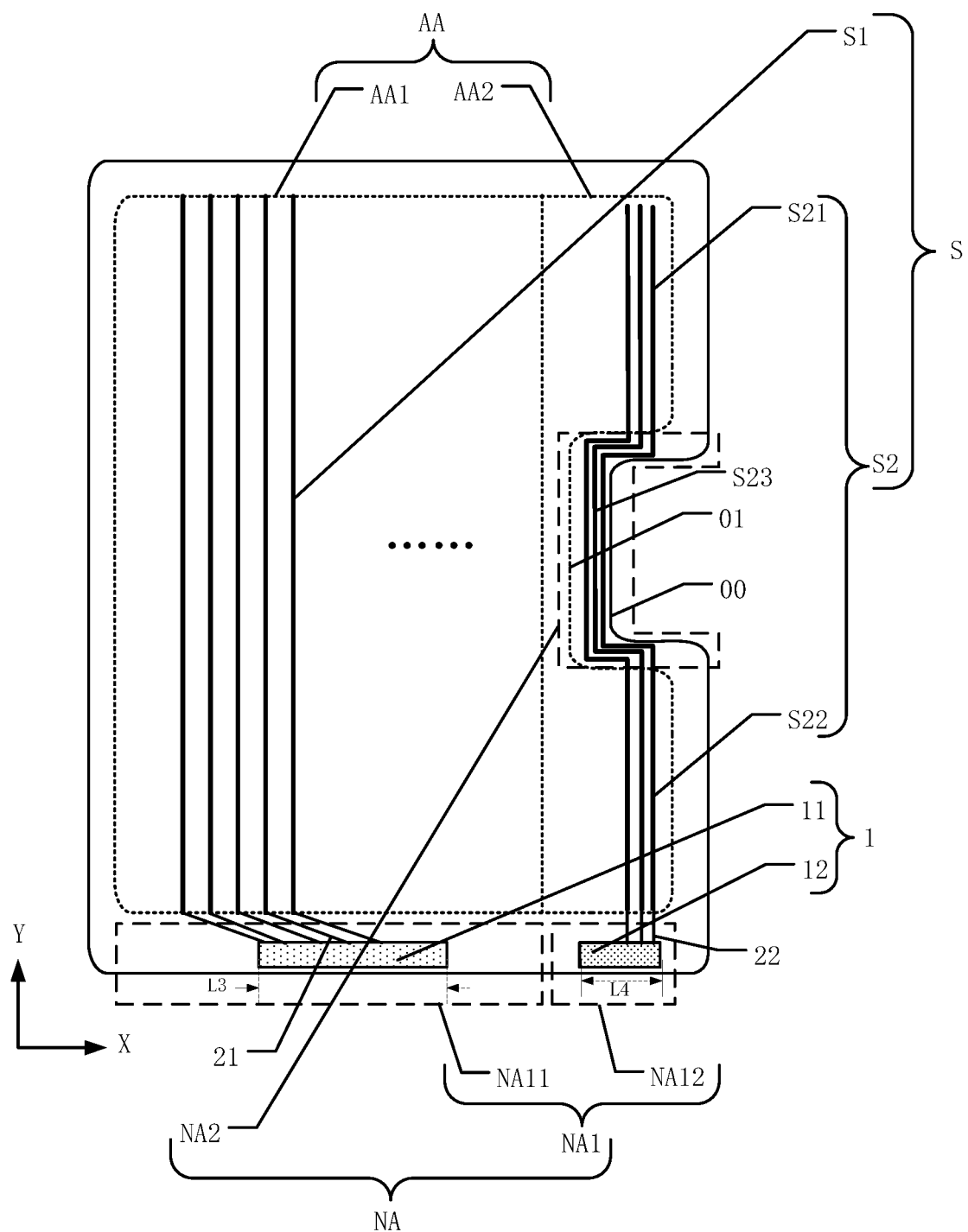
FIG. 5 illustrates a schematic top view of another exemplary array substrate consistent with the disclosed embodiments.

FIG. 5 illustrates a schematic top view of another exemplary array substrate consistent with the disclosed embodiments. The similarities between FIG. 5 and FIG. 4 are not repeated here, while certain differences may be explained. As shown in FIG. 5, the orthogonal projection of the first driving chip 11 onto the array substrate may be completely disposed in the first sub-non-display area NA11, and the orthogonal projection of the second driving chip 12 onto the array substrate may be completely disposed in the second sub-non-display area NA12.

In the disclosed embodiments, in the first direction X, the second driving chip 12 may be arranged closer to the first side of the array substrate (where the notch 00 is arranged at the first side of the array substrate) than the first driving chip 11, the orthogonal projection of the first driving chip 11 onto the array substrate may be completely disposed in the first sub-non-display area NA11, and the orthogonal projection of the second driving chip 12 onto the array substrate may be completely disposed in the second sub-non-display area NA12.

Thus, after the first driving chip 11 and the second driving chip 12 are electrically connected to the data lines S, the second driving chip 12 disposed in the second sub-non-display area NA12 may be electrically connected only to the second data line S2 including the winding portion S23, thereby reducing the length of the second connection line 22 between the second data line S2 and the second driving chip 12. The first driving chip 11 disposed in the first sub-non-display area NA11 may be electrically connected only to the first data lines S1, or electrically connected to the first data lines S1 and some second data lines S2 according to various application scenarios, which is not limited by the present disclosure, as long as the load difference between the first data line S1 and the second data line S2 would be reduced.

Figure 6:
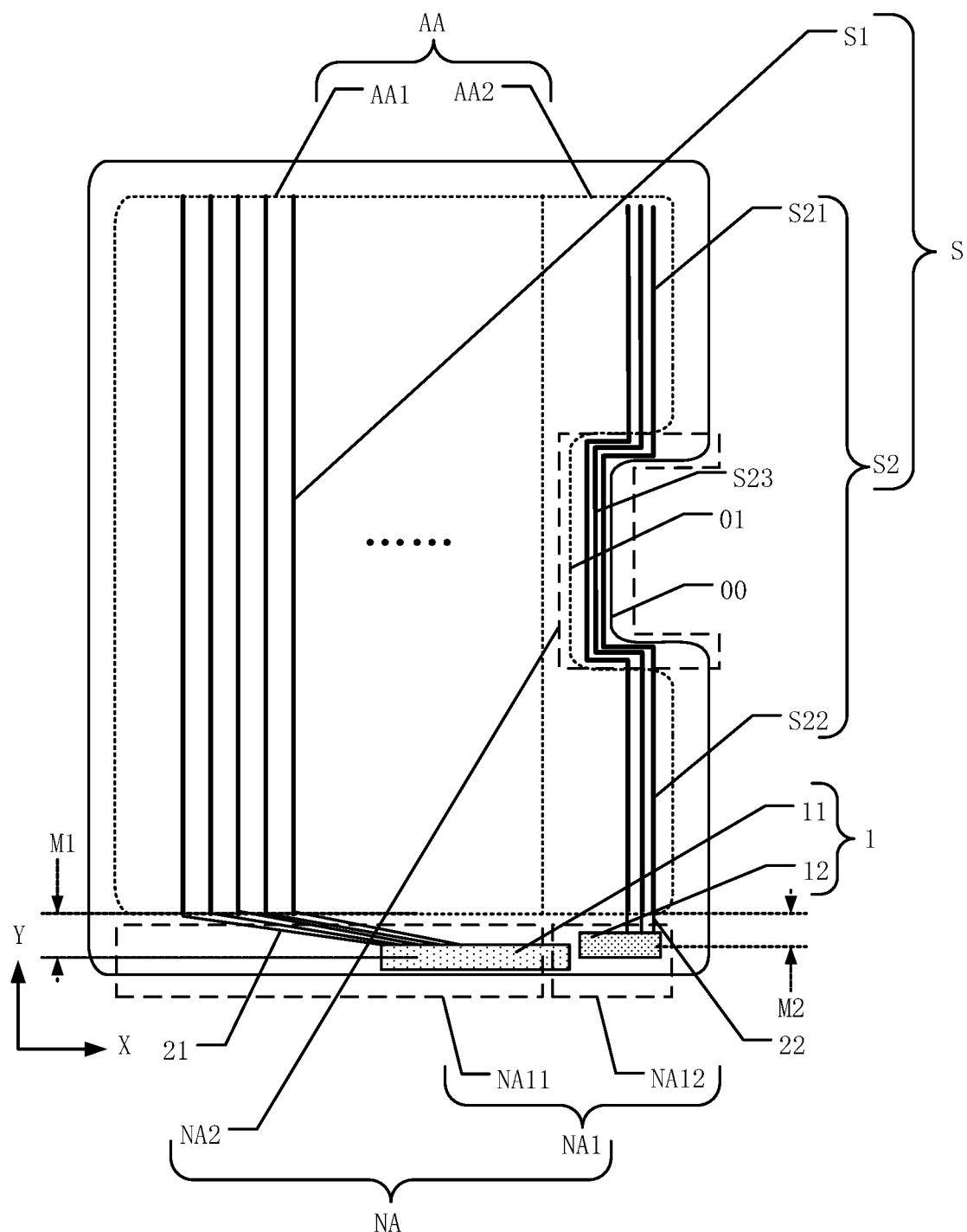
FIG. 6 illustrates a schematic top view of another exemplary array substrate consistent with the disclosed embodiments.
Figure 7:
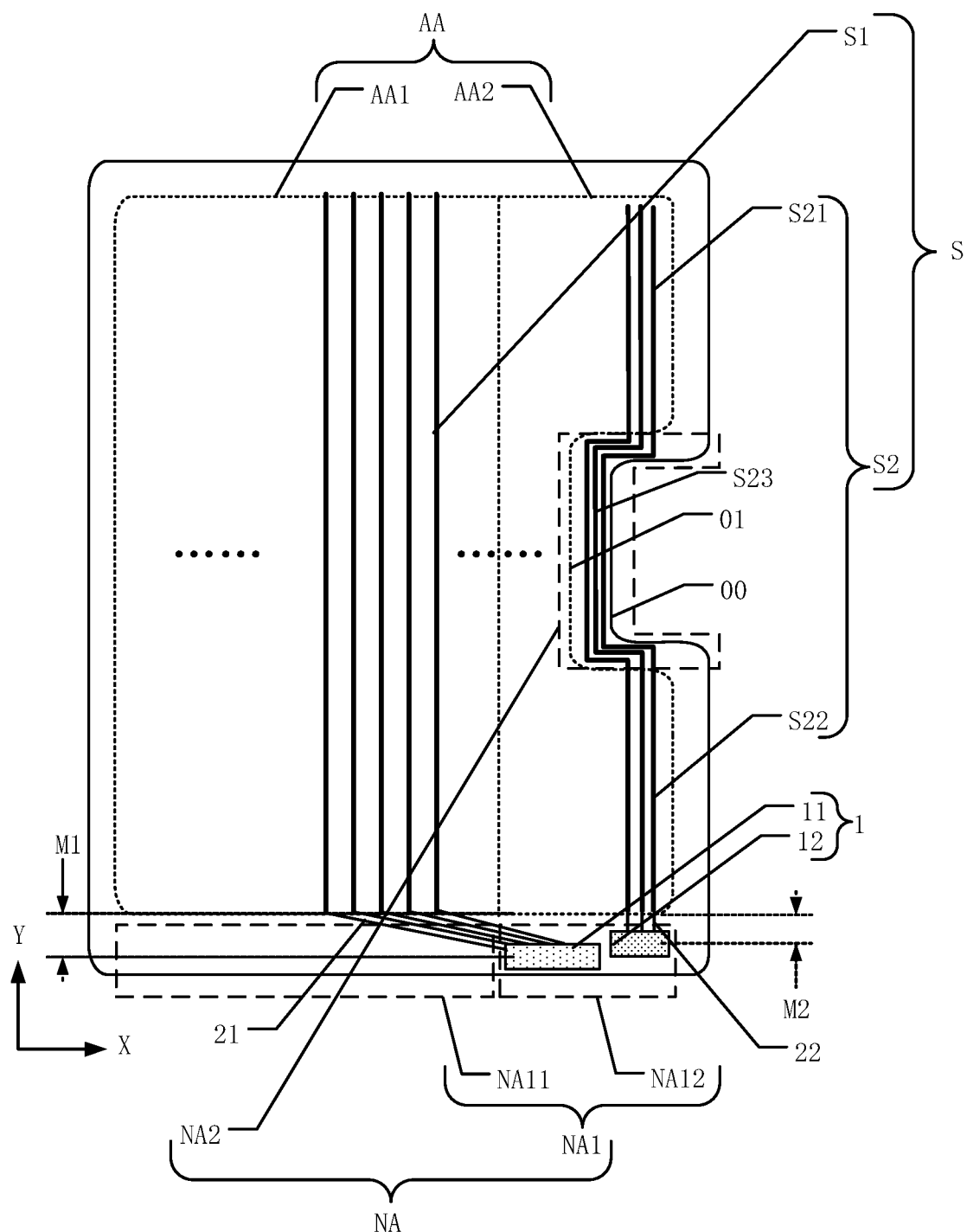
FIG. 7 illustrates a schematic top view of another exemplary array substrate consistent with the disclosed embodiments.
Figure 8:
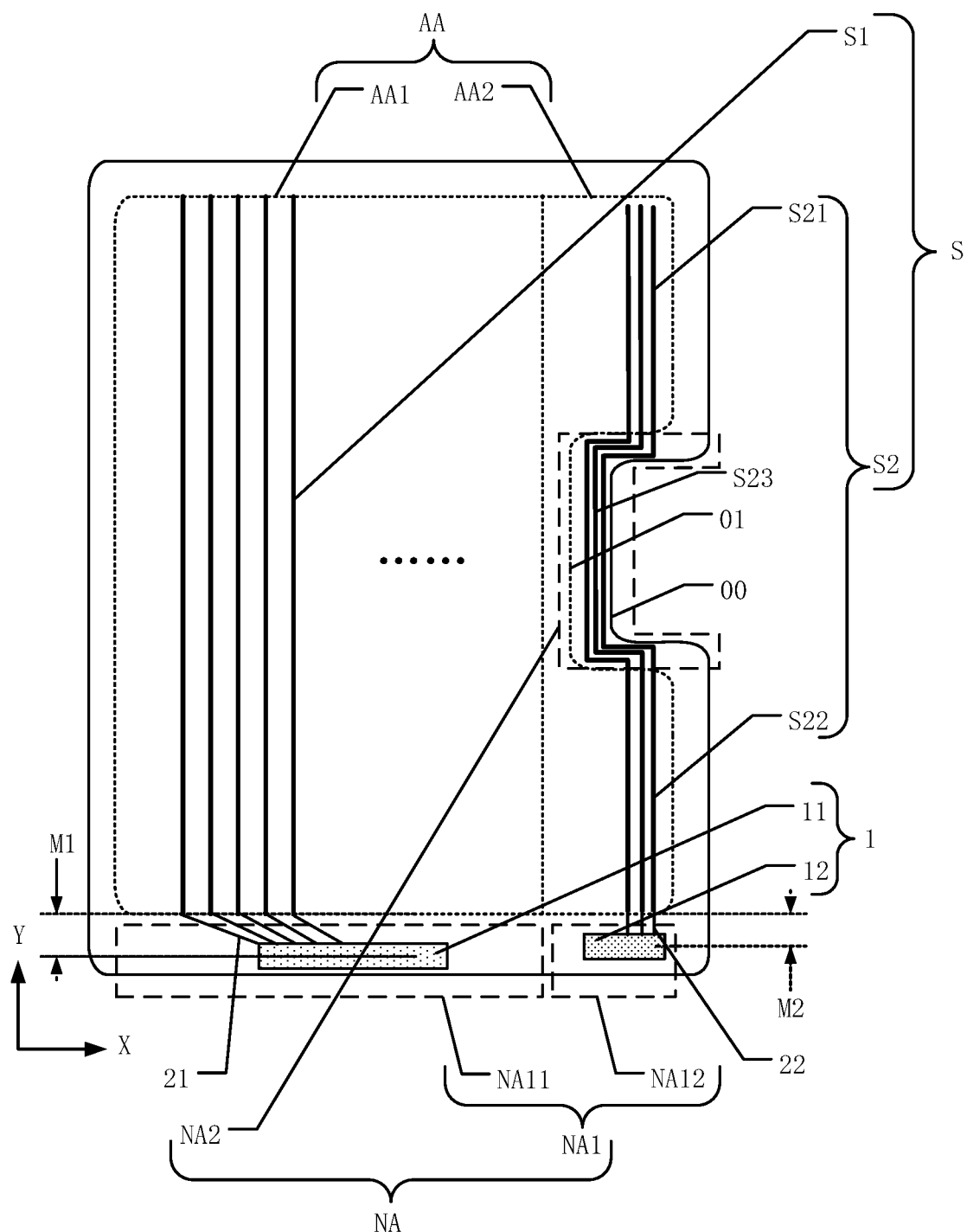
FIG. 8 illustrates a schematic top view of another exemplary array substrate consistent with the disclosed embodiments.

FIGS. 6-8 illustrate schematic top views of exemplary array substrate consistent with the disclosed embodiments. The similarities between FIGS. 6-8 and FIG. 4 are not repeated here, while certain differences may be explained.

As shown in FIGS. 6-8, along the second direction Y, the vertical distance from the geometric center of the first driving chip 11 to the first side of the display area AA is M1, and the vertical distance from the geometric center of the second driving chip 12 to the first side of the display area AA is M2, where M1 is greater than M2, and the difference between M1 and M2 may be equal to or less than approximately 3 mm.

In the disclosed embodiments, the vertical distance between the geometric center of the first driving chip 11 and the first side of the display area AA may be different from the vertical distance between the geometric center of the second driving chip 12 and the first side of the display area AA. That is, in the first direction X, the axes of the first driving chip 11 and the second driving chip 12 may be not on the same line. Because M1 is larger than M2, in the second direction Y, the first driving chip 11 may have a closer distance to the display area AA than the second driving chip 12. Then after the two driving chips 1 are electrically connected to the data lines S at the same time, because in the second direction Y, the second driving chip 12 is closer to the display area AA, the connection line between the second driving chip 12 and the data line S may be reduced. On the other hand, the first driving chip 11 may be further away from the display area AA, such that the connection line between the first driving chip 11 and the data line S may be increased and, accordingly, the load difference between the first data line S1 and the second data line S2 caused by different lengths thereof may be balanced, and the split-screen may be suppressed.

Further, through configuring the difference between M1 and M2 to be equal to or less than approximately 3 mm, the gap between the first driving chip 11 and the second driving chip 12 in the second direction Y may not be substantially large. Thus, on one hand, the load difference between the first data line S1 and the second data line S2 may be reduced to suppress the split-screen. On the other hand, the frame size may be prevented from increasing, the narrow frame design may be realized, and the display performance may be enhanced.

The technical solution provided in the disclosed embodiments may be applicable to the array substrates shown in FIG. 6 to FIG. 8 each of which includes two driving chips 1. As shown in FIG. 6, the orthogonal projection of the first driving chip 11 onto the array substrate may be partially disposed in the second sub-non-display area NA12 and partially disposed in the first sub-non-display area NA11, and the orthogonal projection of the second driving chip 12 onto the array substrate may be completely disposed in the second sub-non-display area NA12. As shown in FIG. 7, the orthogonal projections of both the first driving chip 11 and the second driving chip 12 onto the array substrate may be completely disposed in the second sub-non-display area NA12. As shown in FIG. 8, the orthogonal projection of the first driving chip 11 onto the array substrate may be completely disposed in the first sub-non-display area NA11, and the orthogonal projection of the second driving chip 12 onto the array substrate may be completely disposed in the second sub-non-display area NA12.

The technical solution provided in the disclosed embodiments may also be applicable to other array substrates which include a plurality of driving chips, provided that the driving chip which is arranged closest to the first side of the array substage (where the notch 00 is disposed at the first side) in the first direction X is configured to be arranged closet to the display area AA in the second direction Y, and the details are not described herein.

Figure 9:
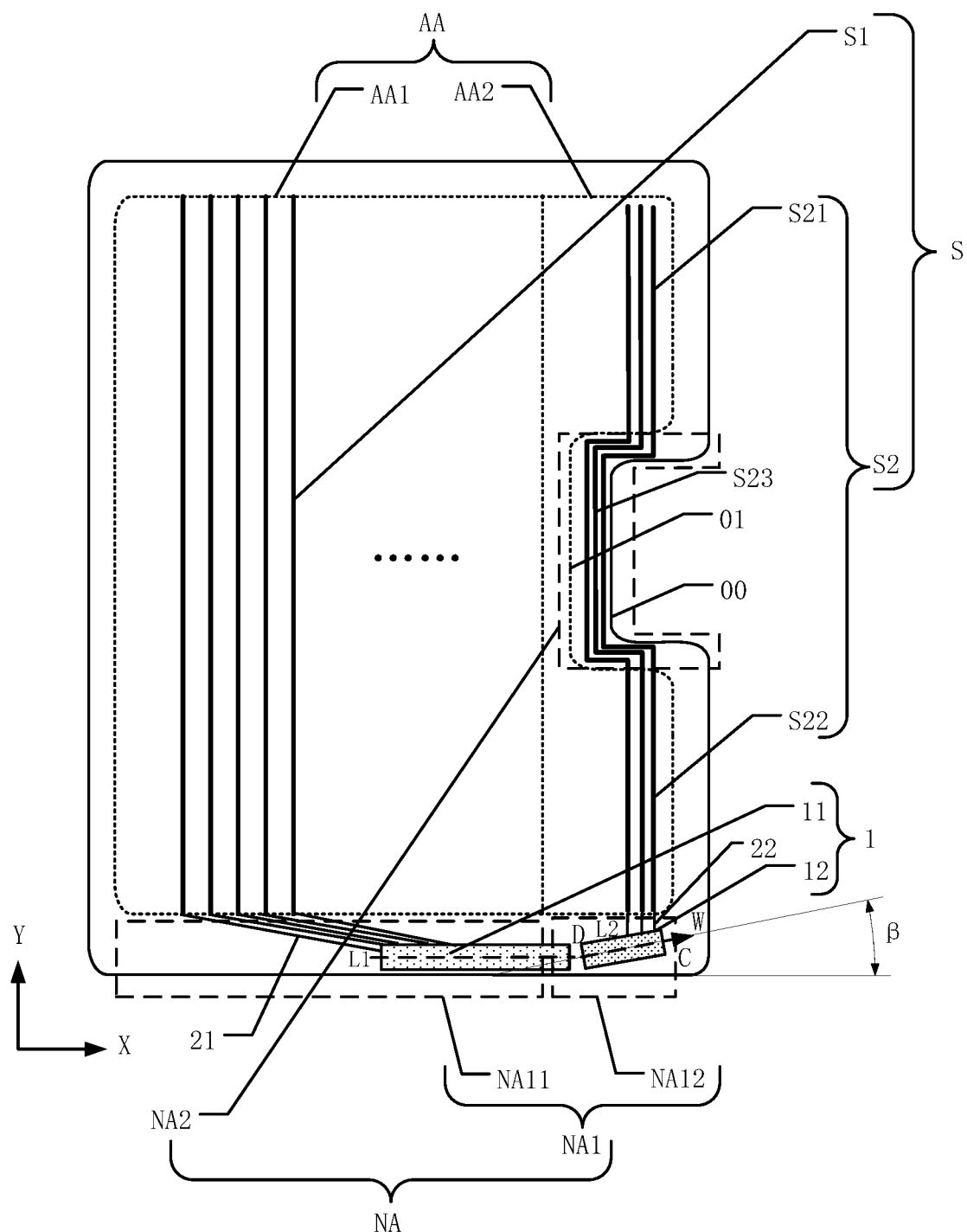
FIG. 9 illustrates a schematic top view of another exemplary array substrate consistent with the disclosed embodiments.
Figure 10:
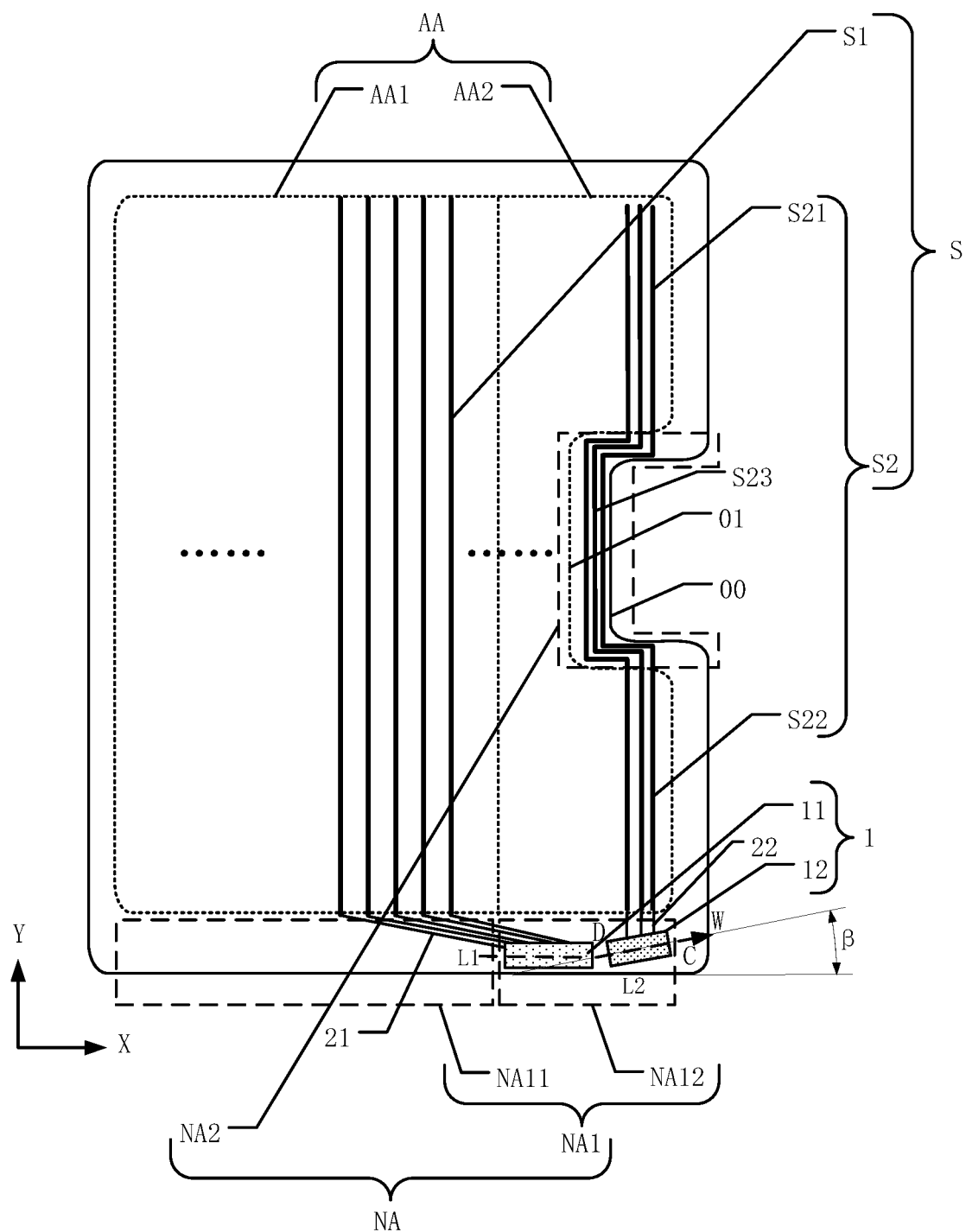
FIG. 10 illustrates a schematic top view of another exemplary array substrate consistent with the disclosed embodiments.
Figure 11:
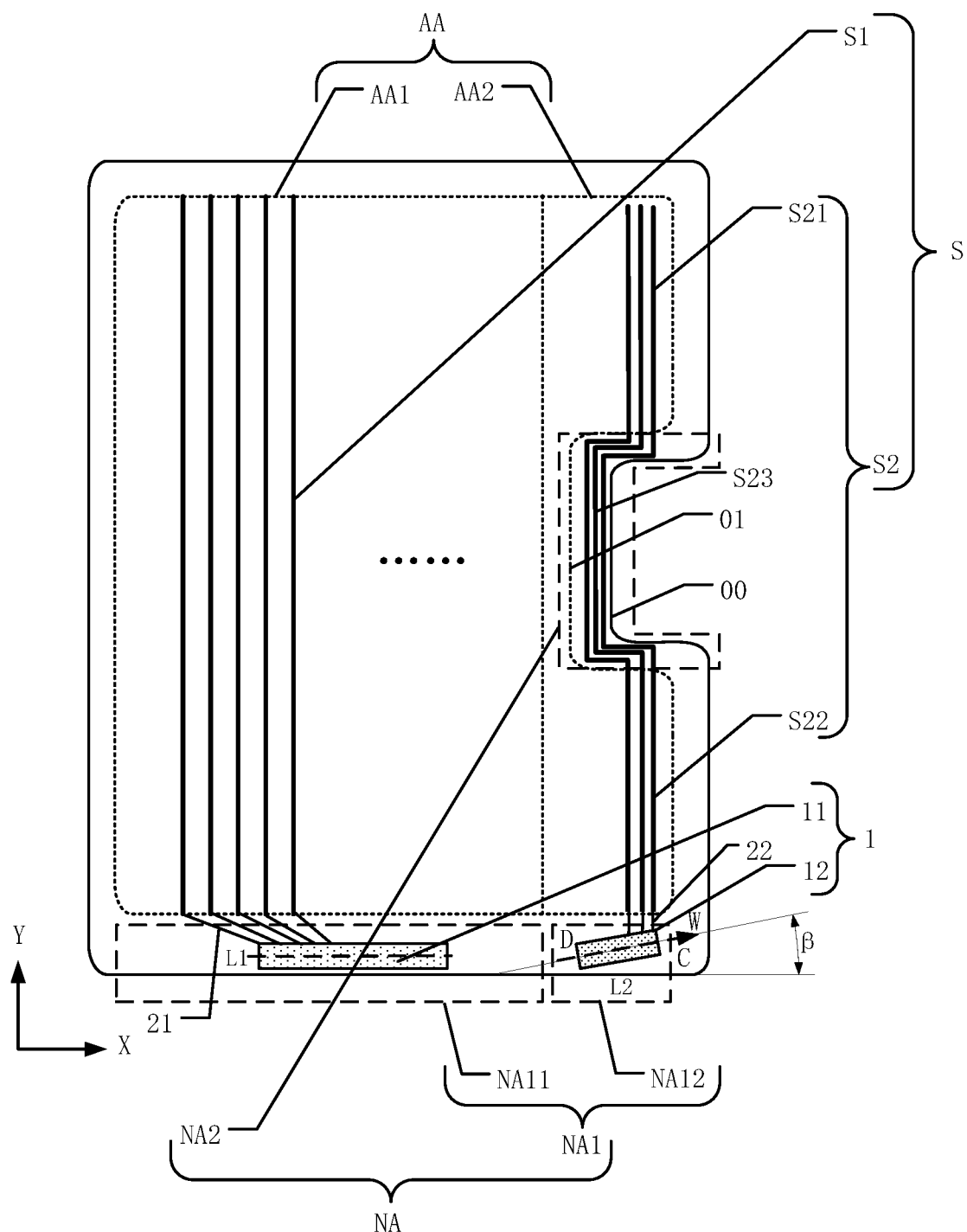
FIG. 11 illustrates a schematic top view of another exemplary array substrate consistent with the disclosed embodiments.

FIGS. 9-11 illustrate schematic top views of exemplary array substrate consistent with the disclosed embodiments. The similarities between FIGS. 6-8 and FIGS. 9-11 are not repeated here, while certain differences may be explained.

As shown in FIGS. 9-11, the first driving chip 11 may have an axis L1 along the length direction of the first driving chip 11, and the axis L1 may be parallel to the first direction X. The second driving chip 12 may have a third end C and a fourth end D along the length direction of the second driving chip 12. In the first direction X, the third end A may be an end close to the first edge portion 01, and the fourth end D may be an end far away from the first edge portion 01. In the second direction, the vertical distance from the third end C to the first side of the display area AA may be smaller than the vertical distance from the fourth end D to the first side of the display area AA. The extending direction of the axis along the length direction of the second driving chip 12 is defined as a fourth direction W, and an acute angle formed by the fourth direction W and the first direction X is defined as a second angle.

In the disclosed embodiments, the driving chip 1 may include the first driving chip 11 and the second driving chip 12, each of which has a striped shape. The arrangement of the first driving chip 11 and the second driving chip 12 in the first sub-non-display area NA11 may be referred to FIGS. 3-5. To further balance the load between the first data line S1 and the second data line S2, the second driving chip 12, which is disposed close to the first side of the array substrate long the first direction, may be disposed in an inclined manner in the first non-display area NA1. That is, the vertical distance from the third end C of the second driving chip 12 to the first side of the display area AA may be smaller than the vertical distance from the fourth end D of the second driving chip 12 to the first side of the display area AA.

Thus, the length of the second connection line 22 between the third end C of the second driving chip 12 and the second data line S2 may be reduced, while the length of the first connection line 21 between the fourth end D of the second driving chip 12 and the first data line S1 may be increased. Accordingly, the second angle formed by the fourth direction Z and the first direction X may be an acute angle. The display failure caused by the split-screen between the first display area AA1 and the second display area AA2 may be further suppressed, and the display performance of the display panel including the array substrate may be improved.

The technical solution provided in the disclosed embodiments may be applicable to the array substrates shown in FIG. 9 to FIG. 11 which include two driving chips 1. As shown in FIG. 9, the orthogonal projection of the first driving chip 11 onto the array substrate may be partially disposed in the second sub-non-display area NA12 and partially disposed in the first sub-non-display area NA11, and the orthogonal projection of the second driving chip 12 onto the array substrate may be completely disposed in the second sub-non-display area NA12. As shown in FIG. 10, the orthogonal projections of both the first driving chip 11 and the second driving chip 12 onto the array substrate may be completely disposed in the second sub-non-display area NA12. As shown in FIG. 11, the orthogonal projection of the first driving chip 11 onto the array substrate may be completely disposed in the first sub-non-display area NA11, and the orthogonal projection of the second driving chip 12 onto the array substrate may be completely disposed in the second sub-non-display area NA12.

The technical solution provided in the disclosed embodiments may also be applicable to other array substrates which include a plurality of driving chips, provided that the driving chip which is arranged closest to the first side of the array substage (where the notch 00 is disposed at the first side) in the first direction X is configured to be disposed in an inclined manner, and the details are not described herein.

In certain embodiments, as shown in FIGS. 9-11, the second angle is β, where β≤15°. The array substrate shown in FIGS. 9-11 further limits the range of the second angle β, i.e., the acute angle formed between the fourth direction W and the first direction X. As the angle β increases, the second driving chip 12 at the third end C may get closer to the first side of the display area AA, and the inclination angle may increase accordingly. The length of the second connection line 22 from the second driving chip 12 at the third end C to the second data line S2 may be further reduced, and the length of the first connection line 21 from the second driving chip 12 at the fourth end D to the first data line S1 may be further increased, thereby further balancing the load difference between the first data line S1 and the second data line S2. However, a substantially large inclination angle of the second driving chip 12 may cause the width of the first non-display area NA1 to be widened in the second direction Y, thereby increasing the frame width of the non-display of the array substrate, which is not in line with the narrow frame design of the display panel.

Thus, in the disclosed embodiments, through configuring the second angle β to be approximately equal to or smaller than approximately 15°, the load difference between the first data line S1 and the second data line S2 may be balanced well, thereby suppressing the split-screen phenomenon. Meanwhile, the narrow frame design of the display panel may be realized, improving the display quality and display effect.

In certain embodiments, referring to FIG. 3 to FIG. 5, the axis along the length direction of the first driving chip 11 may be parallel to the first direction X, and the axis along the length direction of the second driving chip 12 may be parallel to the first direction X. Further, in the first direction X, the length L3 of the first driver chip 11 may be greater than the length L4 of the second driver chip 12.

In the disclosed embodiments, the first non-display area NA1 may be disposed with two driving chips 1 each having a striped shape, the axis along the length direction of the first driving chip 11 may be parallel to the first direction X, and the axis along the length direction of the second driving chip 12 may be parallel to the first direction X. Further, in the first direction X, the length L3 of the first driver chip 11 may be greater than the length L4 of the second driver chip 12. That is, in the first direction X, the second driving chip which is arranged closer to the first side of the array substrate (where the notch 00 is arranged at the first side of the array substrate) may have a smaller length than the first driving chip 11.

Because the first display area AA1 often has a larger area than the second display area AA2, the number of the second data lines S2 may be smaller than the number of the first data lines S1. Through configuring the second driving chip 12 electrically connected to the second data line S2 to have a smaller length in the first direction X, the load between the first data line S1 and the second data line S2 may be balanced. Meanwhile, the first driving chip 11 may be disposed by utilizing the remaining space of the first non-display area NA1, such that the first connection line 21 between the first data line S1 and the first driving chip 11 may be lengthened as much as possible to suppress the split-screen. Accordingly, the display performance may be enhanced.

Figure 12:
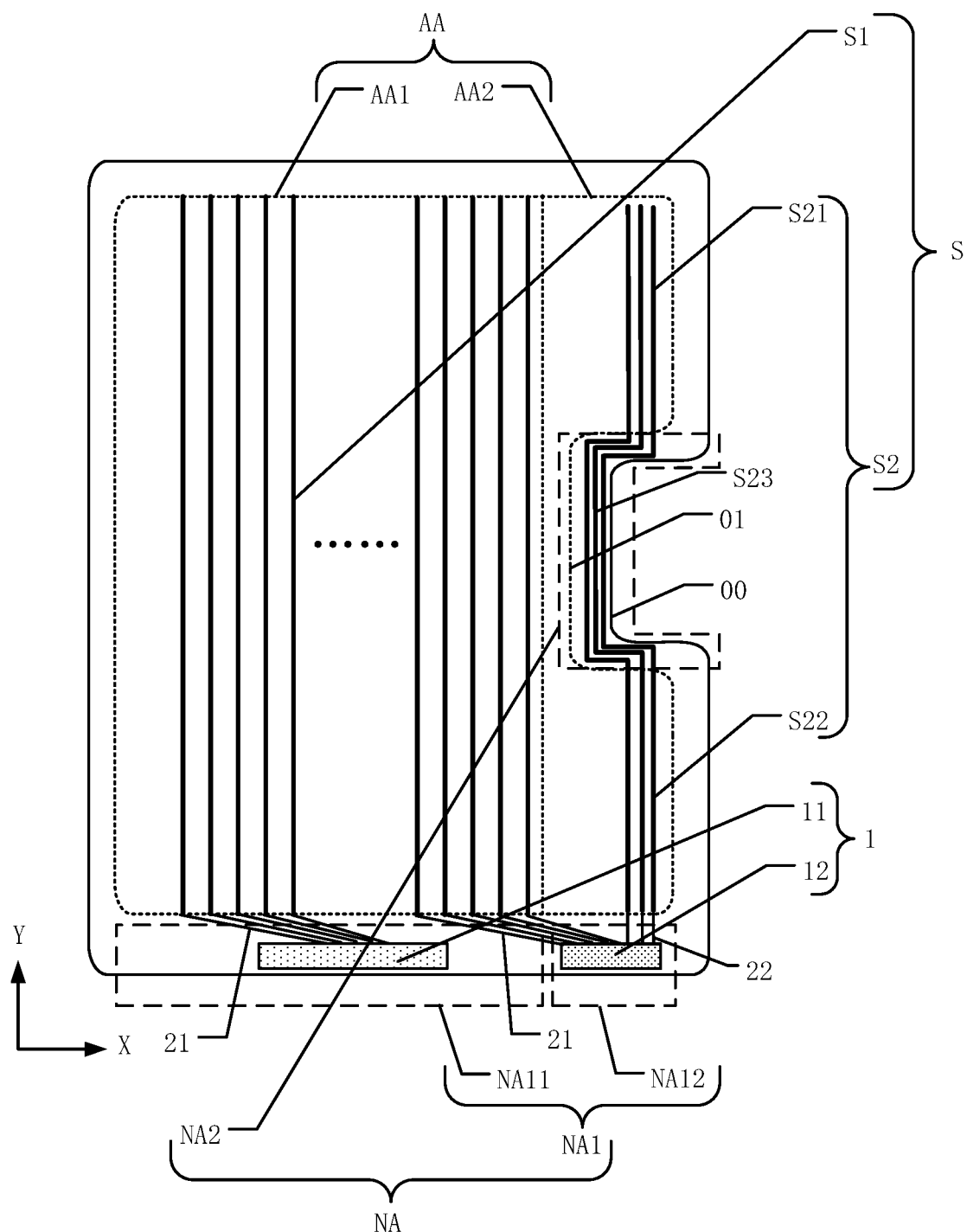
FIG. 12 illustrates a schematic top view of another exemplary array substrate consistent with the disclosed embodiments.
Figure 13:
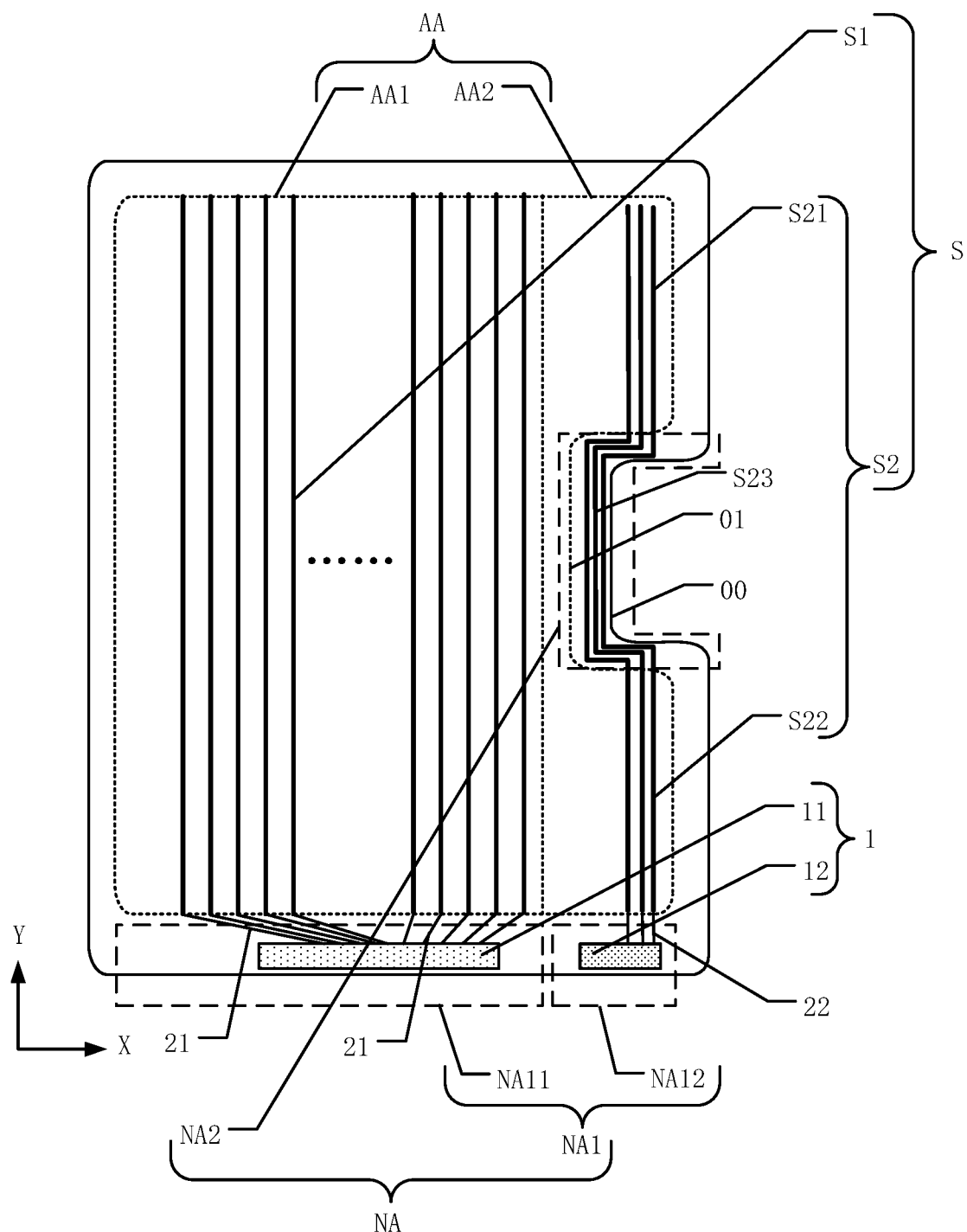
FIG. 13 illustrates a schematic top view of another exemplary array substrate consistent with the disclosed embodiments.

FIGS. 12-13 illustrate schematic top views of exemplary array substrate consistent with the disclosed embodiments. As shown in FIGS. 12-13, the first driving chip 11 may be electrically connected to at least one first data line S1, and the second driving chip 12 may be electrically connected to the second data lines S2.

The disclosed embodiments further illustrate the electrical connections among the first driving chip 11, the second driving chip 12, the first data line S1, and the second data line S2. The first driving chip 11 may be electrically connected to at least one first data line S1, and the second driving chip 12 may be electrically connected to the second data lines S2. In one embodiment, as shown in FIG. 12, the first driving chip 11 may be electrically connected to at least one first data line S1, the second driving chip 12 may be electrically connected to the remaining first data lines S1 and all the second data lines S2. In another embodiment, as shown in FIG. 13, the first driving chip 11 may be electrically connected to all the first data lines S1, and the second driving chip 12 may electrically connected to all the second data lines S2.

In the manufacturing process, the electrical connections of the first driving chip 11, the second driving chip 12, the first data line S1, and the second data line S2 may be determined according to various application scenarios, provided that the length of the second connection line 22 between the second data line S2 and the second driving chip 12 would be reduced to balance the load between the first data line S1 and the second data and suppress the split-screen phenomenon.

It should be noted that, FIG. 12 and FIG. 13 merely illustrate the electrical connection between the data lines S and the driving chip where the first driving chip 11 is disposed in the first sub-non-display area NA11 and the second driving chip 12 is disposed in the second sub-non-display area NA12, which is for illustrative purposes and is not intended to limit the scope of the present disclosure. When the first driving chip 11 and the second driving chip 12 are disposed in the first non-display area NA in other arranging manners, the electrical connection between the data lines S and the driving chip can be understood by those skilled in the art with reference to FIGS. 12-13 and FIGS. 3-5, the details are not described herein.

Figure 14:
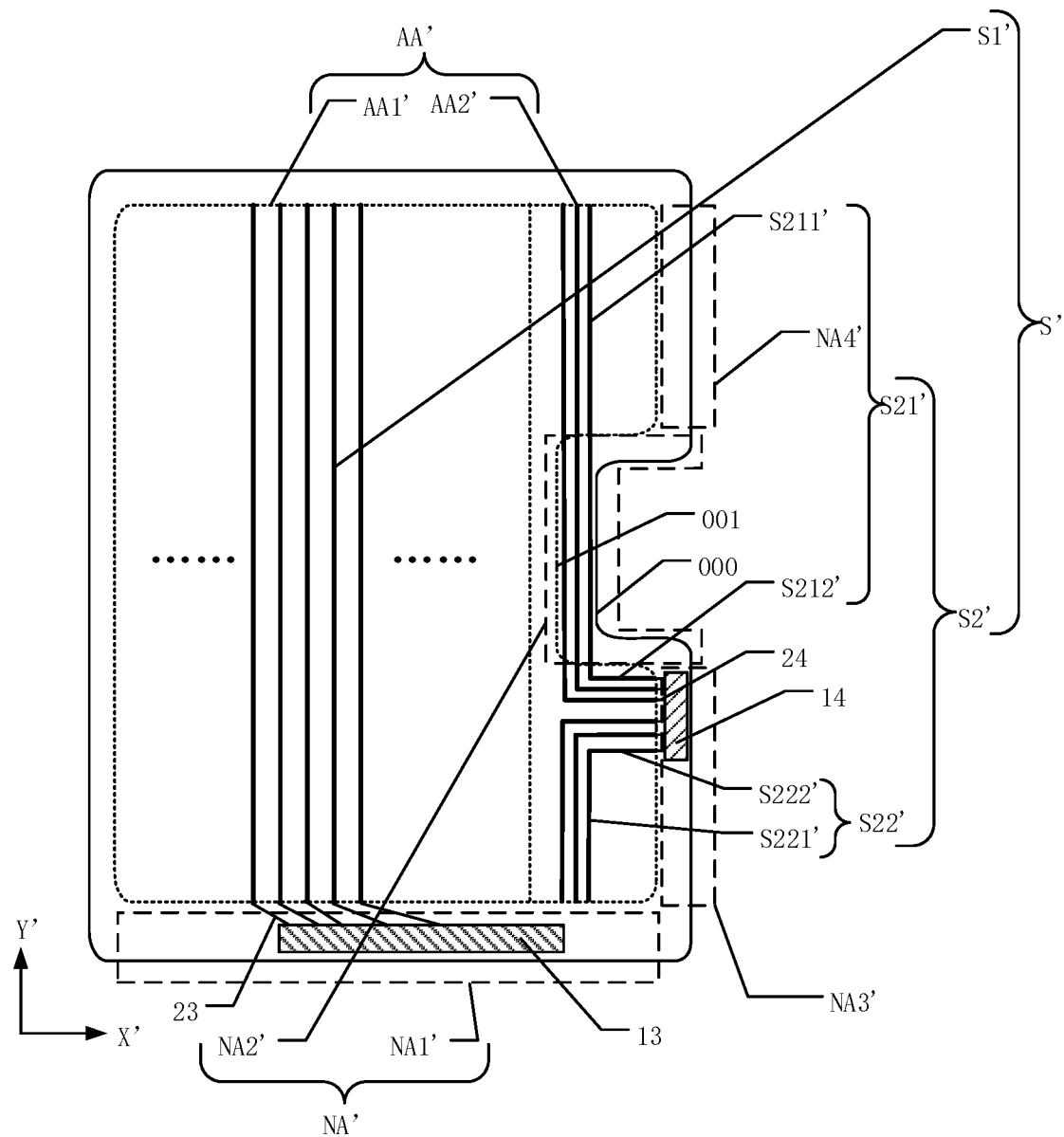
FIG. 14 illustrates a schematic top view of another exemplary array substrate consistent with the disclosed embodiments.

FIG. 14 illustrates a schematic top view of another exemplary array substrate consistent with the disclosed embodiments. The similarities between FIG. 1 and FIG. 14 are not repeated here, while certain differences may be explained. As shown in FIG. 14, the array substrate may include a display area AA', a non-display area NA', and at least one notch 000. The non-display area NA' may be arranged surrounding the display area AA'. The display area AA' may include a first display area AA1' and a second display area AA2' parallelly arranged along the first direction X', and the second display area AA2' may include a first edge portion 001 extending along the second direction Y'. The first edge portion 001 may be recessed towards the inside of the second display area AA2' to form the at least one notch 000.

The non-display area NA' may include a first non-display area NA1' and a second non-display area NA2'. In the second direction Y', the first non-display area NA1' may be disposed at one side of the display area AA', and the second non-display area NA2' may be disposed at the perimeter of the notch 000. The non-display area NA' may further include a third non-display area NA3' and a fourth non-display area NA4'. The third non-display area NA3', the notch 000, and the fourth non-display area NA4' may be arranged along the second direction Y'. The array substrate may include a third driving chip 13 and a fourth driving chip 14. The orthogonal projection of the third driving chip 13 onto the array substrate may be disposed in the first non-display area NA1', and the orthogonal projection of the fourth driving chip 14 onto the array substrate may be disposed in one of the third non-display area NA3' and the fourth non-display area NA4'.

The array substrate may include a plurality of data lines S', and the data line S' may include a plurality of first data lines S1' and a plurality of second data lines S2'. The first data line S1' may be disposed in the first display area AA1' and extending along the second direction Y'. The first data lines S1' may be electrically connected to the third driving chip 13. Each second data line S2' may at least partially pass through the second non-display area NA2'. Each second data line S2' may include a first portion S21' and a second portion S22', in which the first portion S21' may include a first sub-portion S211' extending in the second direction Y' and a first bent portion S212' extending in the first direction X'. The first sub-portion S211' may include a portion disclosed in the second display area AA2' and another portion passing through the second non-display area NA2'. The first bent portion S212' may be disposed in the second display area AA2' and may be electrically connected to the fourth driving chip 14.

The second portion S22' may include a second sub-portion S221' extending along the second direction Y' and a second bent portion S222' extending along the first direction X'. The second sub-portion S221' and the second bent portion S222' may be both disposed in the second display area AA2', and the second bent portion S222' may be electrically connected to the fourth driving chip 14'. The first direction X' may be perpendicular to the second direction Y'.

In the disclosed embodiments, the array substrate may include at least one notch 000, and the notch 000 may be formed by recessing the first edge portion 001 toward the inner portion of the second display region AA2', in which the first edge portion 001 is extending along the second direction Y'. Meanwhile, some of the data lines S' may also extend along the second direction Y', i.e., the array substrate may be an irregular-shaped array substrate having the notch 000 disposed along the column direction Y'. The disclosed irregular-shaped array substrate may satisfy the user demand for diversified shapes, thereby having wide applications.

The display area AA' of the array substrate may include the first display area AA1' and the second display area AA2' parallelly arranged along the first direction X', and the first data lines S1' may be disposed in the first display area AA1' and extending along the second Y'. Each first data line S1' may be electrically connected to the third driving chip 13 through a third connection line 23, and the third driving chip 13 may provide a driving controlling signal to the first data line S1'. The second data line S2' may at least partially pass through the second non-display area NA2'.

The first portion S21' of the second data line S2' may include the first sub-portion S211' extending in the second direction Y' and the first bent portion S212' extending in the first direction X'. The second portion S22' of the second data line S2' may include the second sub-portion S221' extending in the second direction Y' and the second bent portion S222' extending in the first direction X'. That is, the first portion S21' and the second portion S22' may each have a L-shaped structure, and may be both electrically connected to the fourth driving chip 14 through a fourth connection line 24. The orthogonal projection of the fourth driving chip 14 onto the array substrate may be disposed in one of the third non-display area NA3' and the fourth non-display area NA4', i.e., the fourth driving chip 14 may be disposed in one of the non-display areas located on both sides of the notch 000.

Thus, the width of the second non-display area NA2' which is disposed at the perimeter of the notch 000 may be reduced and, meanwhile, the length of the fourth connection line 24 between the second data line S2' and the fourth driving chip 14 may be reduced, which may balance the lengths of the second data line S2' and the first data line S1'. Accordingly, the load between the second data line S2' and the first data line S1' may be balanced to suppress the split-screen, and the display performance of the display panel including the array substrate may be improved.

In the disclosed embodiments, the first direction X' may be perpendicular to the second direction Y'. In one embodiment, first direction X' may be the extending direction of the scanning line (not drawn in FIG. 14) on the array substrate, i.e., a row direction, and the second direction Y' may be a column direction perpendicular to the row direction.

Figure 15:
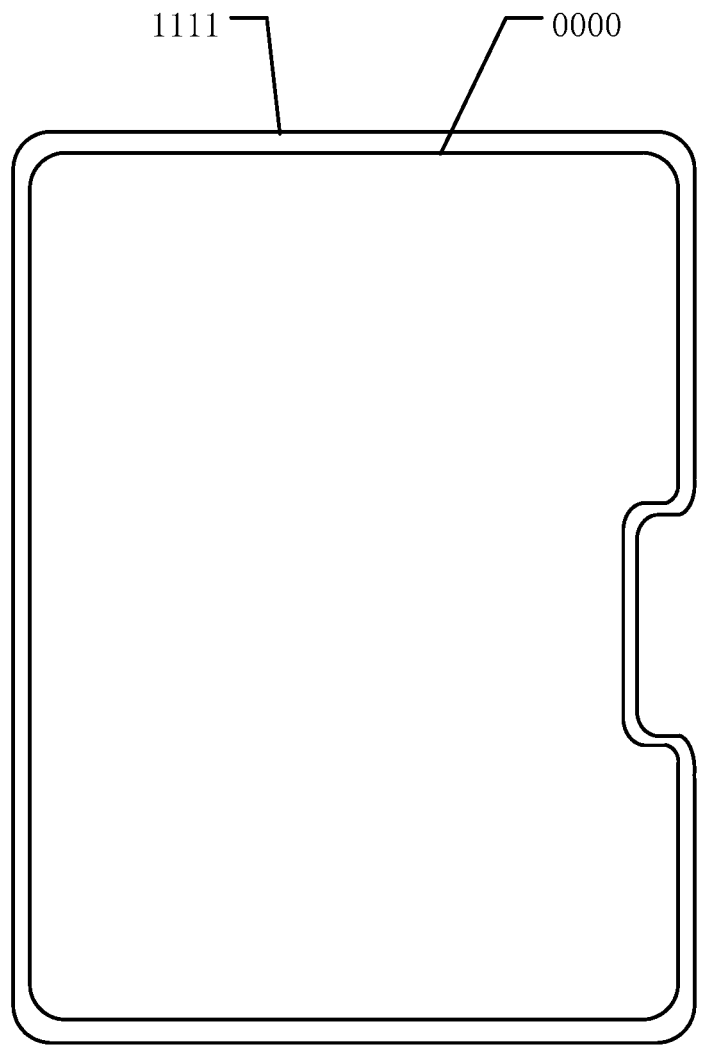
FIG. 15 illustrates a schematic top view of an exemplary display panel consistent with the disclosed embodiments.

The present disclosure also provides a display panel comprising the disclosed array substrate. FIG. 15 illustrates a schematic view of an exemplary display panel 1111 consistent with the disclosed embodiments. As shown in FIG. 15, the display panel 1111 may include an array substrate 0000, which is any one of the disclosed array substrate. FIG. 15 shows the display panel 1111 may be a mobile phone, which is for illustrative purposes. The display panel 1111 may also be a display device having a display function, such as a mobile phone, a television, a vehicle display, etc., which is not limited by the present disclosure. Because the disclosed display panel includes any one of the disclosed array substrates, the disclosed display panel may also have the same features as the disclosed array substrate, and details are not described herein again.

In the disclosed embodiments, along the first direction, through configuring the driving chip to be arranged close to the first side of the array substrate (where the notch is arranged at the first side of the array substrate), an asymmetric arrangement of the driving chip in the first non-display area may be realized. After the second data lines are electrically connected to the driving chip, the length of the connection line between the second data lines and the driving chip may be reduced, and the load difference between the first data line and the second data line due to the increase of the length of the second data line may be reduced.

In another embodiment, through configuring the driving chip which is electrically connected to the second data lines to be disposed in one of the non-display areas arranged on both sides of the notch, the width of the second non-display area which is disposed at the perimeter of the notch may be reduced. Meanwhile, the length of the connection line between the second data line and the driving chip may be reduced.

Thus, in the disclosed embodiments, the load difference of the second data line and the first data line may be reduced, the display failure caused by the split-screen between the first display area and the second display area may be further suppressed. Accordingly, the display performance of the display panel including the array substrate may be improved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An array substrate, comprising:
   a display area including a first display area and a second display area parallelly arranged along a first direction, wherein the second display area includes a first edge portion extending along a second direction;
   a non-display area including a first non-display area and a second non-display area, wherein in the second direction, the first non-display area is disposed at one side of the display area and includes a first sub-non-display area and a second sub-non-display area parallelly arranged along the first direction, the first sub-non-display area and the second sub-non-display area are disposed corresponding to the first display area and the second display area, respectively;
   at least one notch, wherein the first edge portion of the second display area is recessed toward an inside of the second display area to form the at least one notch;
   a plurality of data lines, wherein the plurality of data lines include a plurality of first data lines and a plurality of second data lines, the first data lines are disposed in the first display area and extending along the second direction, a second data line includes a first portion, a second portion and a winding portion, the first portion and the second portion are both disposed in the second display area and extending in the second direction, and the winding portion is disposed in the second non-display area; and
   at least one driving chip electrically connected to the data lines, wherein an orthogonal projection of the at least one driving chip onto the array substrate is at least partially located in the second sub-non-display area, wherein the second non-display area is disposed at perimeter of the at least one notch, and the first direction is perpendicular to the second direction.

2. The array substrate according to claim 1, wherein:
   the at least one driving chip has a striped shape;
   along a length direction of the at least one driving chip, the at least one driving chip has a first end and a second end, wherein in the first direction, the first end is an end close to the first edge portion, and the second end is end far away from the first edge portion;
   in the second direction, a vertical distance from the first end to a side of the display area is smaller than a vertical distance from the second end to the side of the display area, wherein the side of the display area is extending in the first direction; and
   an extending direction of an axis along the length direction of the at least one driving chip is a third direction, and an acute angle formed by the third direction and the first direction is a first angle.

3. The array substrate according to claim 2, wherein:
   the first angle is $\alpha$, where $\alpha \leq 15°$.

4. The array substrate according to claim 1, wherein:
   the at least one driving chip includes a first driving chip and a second driving chip both disposed in the first non-display area, and both the first driving chip and the second driving chip have striped shapes.

5. The array substrate according to claim 4, wherein:
   an orthogonal projection of the first driving chip onto the array substrate is at least partially disposed in the second sub-non-display area; and
   an orthogonal projection of the second driving chip onto the array substrate is disposed in the second sub-non-display area.

6. The array substrate according to claim 4, wherein:
   an orthogonal projection of the first driving chip onto the array substrate is disposed in the first sub-non-display area; and
   an orthogonal projection of the second driving chip onto the array substrate is disposed in the second sub-non-display area.

7. The array substrate according to claim 5, wherein:
   along the second direction, a vertical distance from a geometric center of the first driving chip to the side of the display area is M1; and
   a vertical distance from a geometric center of the second driving chip to the side of the display area is M2, where M1 is greater than M2, and a difference between M1 and M2 is equal to or less than approximately 3 mm.

8. The array substrate according to claim 6, wherein:
   along the second direction, a vertical distance from a geometric center of the first driving chip to the side of the display area is M1; and
   a vertical distance from a geometric center of the second driving chip to the side of the display area is M2, where M1 is greater than M2, and a difference between M1 and M2 is equal to or less than approximately 3 mm.

9. The array substrate according to claim 5, wherein:
   the first driving chip has an axis along a length direction of the first driving chip and the axis is parallel to the first direction;
   the second driving chip has a third end and a fourth end along a length direction of the second driving chip, wherein in the first direction, the third end is an end close to the first edge portion, and the fourth end is an end far away from the first edge portion;
   in the second direction, a vertical distance from the third end to the side of the display area is smaller than the vertical distance from the fourth end to the side of the display area; and an extending direction of the axis along the length direction of the second driving chip is a fourth direction, and an acute angle formed by the fourth direction and the first direction is a second angle.

10. The array substrate according to claim 6, wherein:
the first driving chip has an axis along a length direction of the first driving chip and the axis is parallel to the first direction;
the second driving chip has a third end and a fourth end along a length direction of the second driving chip, wherein in the first direction, the third end is an end close to the first edge portion, and the fourth end is an end far away from the first edge portion;
in the second direction, a vertical distance from the third end to the side of the display area is smaller than the vertical distance from the fourth end to the side of the display area; and
an extending direction of the axis along the length direction of the second driving chip is a fourth direction, and an acute angle formed by the fourth direction and the first direction is a second angle.

11. The array substrate according to claim 9, wherein:
the second angle is β, where β≤15°.

12. The array substrate according to claim 10, wherein:
the second angle is β, where β≤15°.

13. The array substrate according to claim 5, wherein:
an axis along a length direction of the first driving chip is parallel to the first direction;
an axis along a length direction of the second driving chip is parallel to the first direction; and
in the first direction, the first driver chip has a length greater than the second driver chip.

14. The array substrate according to claim 6, wherein:
an axis along a length direction of the first driving chip is parallel to the first direction;
an axis along a length direction of the second driving chip is parallel to the first direction; and
in the first direction, the first driver chip has a length greater than the second driver chip.

15. The array substrate according to claim 13, wherein:
the first driving chip is electrically connected to at least one first data line, and the second driving chip is electrically connected to the plurality of second data lines.

16. The array substrate according to claim 14, wherein:
the first driving chip is electrically connected to at least one first data line, and the second driving chip is electrically connected to the plurality of second data lines.

17. An array substrate, comprising:
a display area including a first display area and a second display area parallelly arranged along a first direction, wherein the second display area includes a first edge portion extending along a second direction;
a non-display area including a first non-display area, a second non-display area, a third non-display area and a fourth non-display area, wherein in the second direction, the first non-display area is disposed at one side of the display area;
at least one notch, wherein the first edge portion of the second display area is recessed toward an inside of the second display area to form the at least one notch;
a first driving chip and a second driving chip, wherein an orthogonal projection of the first driving chip onto the array substrate is disposed in the first non-display area, and an orthogonal projection of the second driving chip onto the array substrate is disposed in one of the third non-display area and the fourth non-display area; and
a plurality of data lines including a plurality of first data lines and a plurality of second data lines, wherein:
the first data lines are disposed in the first display area, extending along the second direction, and electrically connected to the first driving chip,
a second data line at least partially passes through the second non-display area and includes a first portion and a second portion,
the first portion includes a first sub-portion extending in the second direction and a first bent portion extending in the first direction, the first sub-portion includes a portion disclosed in the second display area and another portion passing through the second non-display area, and the first bent portion is disposed in the second display area and is electrically connected to the second driving chip,
the second portion includes a second sub-portion extending along the second direction and a second bent portion extending along the first direction, the second sub-portion and the second bent portion are both disposed in the second display area, and the second bent portion is electrically connected to the second driving chip,
wherein the second non-display area is disposed at perimeter of the at least one notch,
the third non-display area, the at least one notch, and the fourth non-display area are arranged along the second direction, and
the first direction is perpendicular to the second direction.

18. A display panel, comprising:
an array substrate, where the array substrate comprises:
a display area including a first display area and a second display area parallelly arranged along a first direction, wherein the second display area includes a first edge portion extending along a second direction;
a non-display area including a first non-display area and a second non-display area, wherein in the second direction, the first non-display area is disposed at one side of the display area and includes a first sub-non-display area and a second sub-non-display area parallelly arranged along the first direction, the first sub-non-display area and the second sub-non-display area are disposed corresponding to the first display area and the second display area, respectively;
at least one notch, wherein the first edge portion of the second display area is recessed toward an inside of the second display area to form the at least one notch;
a plurality of data lines, wherein the plurality of data lines include a plurality of first data lines and a plurality of second data lines, the first data lines are disposed in the first display area and extending along the second direction, a second data line includes a first portion, a second portion and a winding portion, the first portion and the second portion are both disposed in the second display area and extending in the second direction, and the winding portion is disposed in the second non-display area; and
at least one driving chip electrically connected to the data lines, wherein an orthogonal projection of the at least one driving chip onto the array substrate is at least partially located in the second sub-non-display area, wherein the second non-display area is disposed at perimeter of the at least one notch, and the first direction is perpendicular to the second direction.

\* \* \* \* \*